United States Patent [19]

Tohyama

[11] Patent Number: 5,271,549

[45] Date of Patent: Dec. 21, 1993

[54] MULTIPLE-LEAD ELEMENT SOLDERING METHOD USING SHEET SOLDER

[75] Inventor: Toshio Tohyama, Saitama, Japan

[73] Assignee: Sony Corporation, Japan

[21] Appl. No.: 21,685

[22] Filed: Feb. 24, 1993

[30] Foreign Application Priority Data

Mar. 30, 1992 [JP] Japan .................... 4-102545

[51] Int. Cl.$^5$ ............................................. H05K 3/34
[52] U.S. Cl. .................... 228/180.21; 228/223; 228/249; 228/102
[58] Field of Search ............ 228/102, 103, 179, 180.2, 228/207, 223, 246, 249, 250; 29/741, 743, 832, 840

[56] References Cited

U.S. PATENT DOCUMENTS 3,574,923  4/1971  Cushman ............... 228/180.2
5,180,097  1/1993  Zenshi .................. 228/180.2

FOREIGN PATENT DOCUMENTS 51694  2/1989  Japan ................... 228/180.2

OTHER PUBLICATIONS

IBM Technical Disclosure Bulletin, "Contact Solder Reflow Frame", vol. 30, No. 3, Aug. 1987.

*Primary Examiner*—Samuel M Heinrich
*Attorney, Agent, or Firm*—Ronald P. Kananen

[57] ABSTRACT

A multiple-lead element soldering method of this invention contains a step of beforehand mounting a band-shaped sheet solder on a wiring board so as to be bridged over land portions of a wiring pattern on which lead terminals of the multiple-lead element are to be soldered, and a step of heating the band-shaped sheet solder by a heat press method to melt the band-shaped sheet solder, whereby the land portions of the wiring pattern and the lead terminals of the multiple-lead element are accurately soldered through the melted band-shaped sheet solder with sufficient amount of solder.

5 Claims, 3 Drawing Sheets

SHEET SOLDER SETTING

QFP SETTING

HEAD DESCENDING•PRESS• HEAT•COOL

HEAD ASCENDING

SHEET SOLDER SETTING

QFP SETTING

HEAD DESCENDING•PRESS•
HEAT•COOL

HEAD ASCENDING

MULTIPLE-LEAD ELEMENT SOLDERING METHOD USING SHEET SOLDER

BACKGROUND OF THE INVENTION

1. Field of the Invention

This invention relates to a method for soldering a multiple-lead semiconductor element (LSI) having multiple leads such as a large-capacity memory controller, a DRAM, etc. on a wiring board.

2. Description of Related Art

Recently, a high-density semiconductor circuit (a large-scale integration: LSI) circuit having multiple lead terminals has been developed in order to satisfy a requirement for making a semiconductor circuit high density. In addition, in order to miniaturize the LSI circuit as described above, a wiring board having thereon a wiring pattern which is so designed that a wiring pattern interval and a land interval of the wiring pattern are set to fine pitch (0.5 mm) has been frequently used.

FIG. 1(A) is a schematic diagram showing a conventional soldering method of soldering a QFP type of semiconductor circuit (LSI) on a fine-pitch wiring pattern. In FIG. 1(A), a reference numeral 1 represents a surface mount device (SMD) having multiple lead terminals 2 projected from the bottom surface thereof, and a reference numeral 3 represents a fine-pitch wiring pattern having plural land portions, which is formed on a print board.

Each of the lead terminals 2 of the SMD 1 is so designed to have the width below 0.2 mm and the thickness below 100 μm, for example, and the dimensional precision of each lead terminal has an error of several %. Therefore, when an ordinary soldering method is conducted on such lead terminals 2 of the SMD 1, failure of soldering occurs due to lead float, defective soldering, etc. after the SMD 1 is actually mounted on the wiring board, so that yield of a semiconductor circuit is reduced and its reliability is lowered.

In order to overcome the above disadvantage, the following soldering method has been conventionally conducted on the SMD 1. That is, a soldering plating is beforehand conducted on the wiring pattern side, the SMD 1 is positioned on the wiring pattern 3 so that the lead terminals 2 are positionally coincident with the land portions of the wiring pattern 3, and then the lead terminals 2 are heated from their upper sides by a heat press thereby soldering the lead terminals 2 on the wiring pattern 3. However, in this method, it is difficult to perform the connection between the lead terminals 2 and the land portions 3 with sufficient amount of solder because the soldering plating enables solder to be laminated merely in 30 μm thickness at maximum. In addition, the soldering plating contains a large amount of tin, and thus its connection strength is low.

In order to perform the soldering with large amount of solder by the heat press, flux-cored cream solder is coated on predetermined portions (land portions) of the wiring pattern by a screen printing method or the like, and then the multiple lead terminals are heated under press by the heat press, thereby soldering the SMD 1 on the wiring pattern. In this case, if sufficient amount of cream solder is fed, the cream solder 4 is coated on the land portions of the wiring pattern in semi-paste form as shown in FIG. 1(B). Thereafter, the lead terminals 2 of the SMD 1 is mounted on the cream solder 4, and then pushed against the cream solder 4 while heated by the heat press (trowel), so that the lead terminals 2 are soldered onto the wiring pattern 3 through the cream solder 4. Thereafter, the heat press is cooled, and then is drawn up, thereby completing the soldering process.

In the above method, if the amount of cream solder is sufficient, the soldering with sufficient strength can be conducted. However, the surface shape of the cream solder becomes hemispherical as shown in FIG. 1(B), so that when the lead terminals 2 are pushed by the heat press, each lead terminal is applied with a force in a direction as indicated by an arrow which is laterally deviated from the center portion of the lead terminal.

Since the dimensional precision of the lead terminals of the SMD 1 can not be set to a high value, there occurs a problem that when the SMD 1 is soldered on a wiring pattern of fine pitch, a soldering bridge frequently occurs due to irregularity of pitch interval of the wiring pattern.

SUMMARY OF THE INVENTION

An object of this invention is to provide a multiple-lead element soldering method in which sufficient amount of solder can be supplied for a soldering process to prevent lead float and defective soldering.

Another object of this invention is to provide a multiple-lead element soldering method in which the soldering process can be carried out in accordance with the kind of a multiple-lead element such as LSI to improve producibility.

Another object of this invention is to provide a multiple-lead element soldering method in which the multiple-lead element can be mounted on a wiring board with no positional deviation and thus the multiple-lead element can be accurately soldered to a desired position.

In order to attain the above objects, the multiple-lead element soldering method of this invention contains a step of beforehand mounting a band-shaped sheet solder at portions on which lead terminals of the multiple-lead element are to be soldered, and a step of heating the band-shaped sheet solder by a heat press method to perform a soldering process.

According to the multiple-lead element soldering method of this invention, the band-shaped sheet solder is so designed as to be flat, so that the multiple-lead element is not positionally deviated when it is subjected to a heat press process. In addition, the supply amount of the solder is adjusted by varying the thickness of the band-shaped sheet solder, so that the soldering process can be carried out with sufficient amount of solder.

DETAILED DESCRIPTION OF PREFERRED EMBODIMENT

A preferred embodiment according to this invention will be described with reference to the accompanying drawings.

Figure 1A:
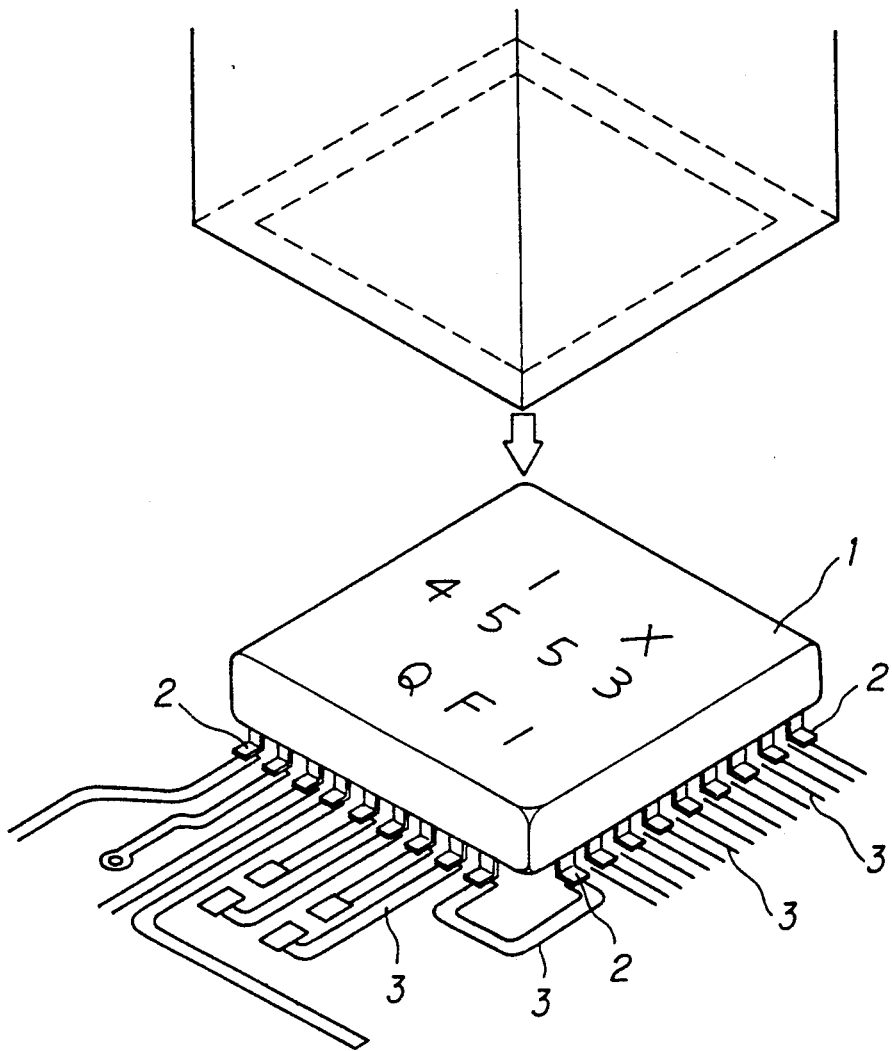
FIG. 1(A) is a schematic diagram showing a conventional soldering method of soldering an SMD (LSI) serving as a multiple lead element on fine-pitch wiring pattern.
Figure 1B:
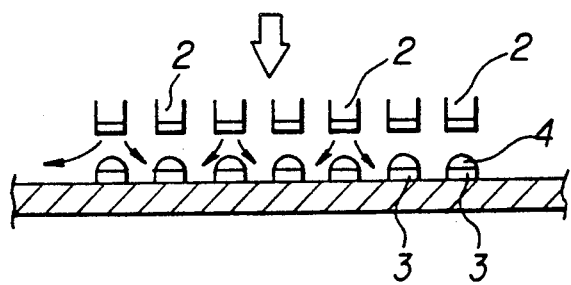
FIG. 1(B) is a side view showing the positional relationship between the land portions of the wiring pattern and the multiple lead terminals of the SMD in the conventional soldering method of FIG. 1(A)
Figure 2:
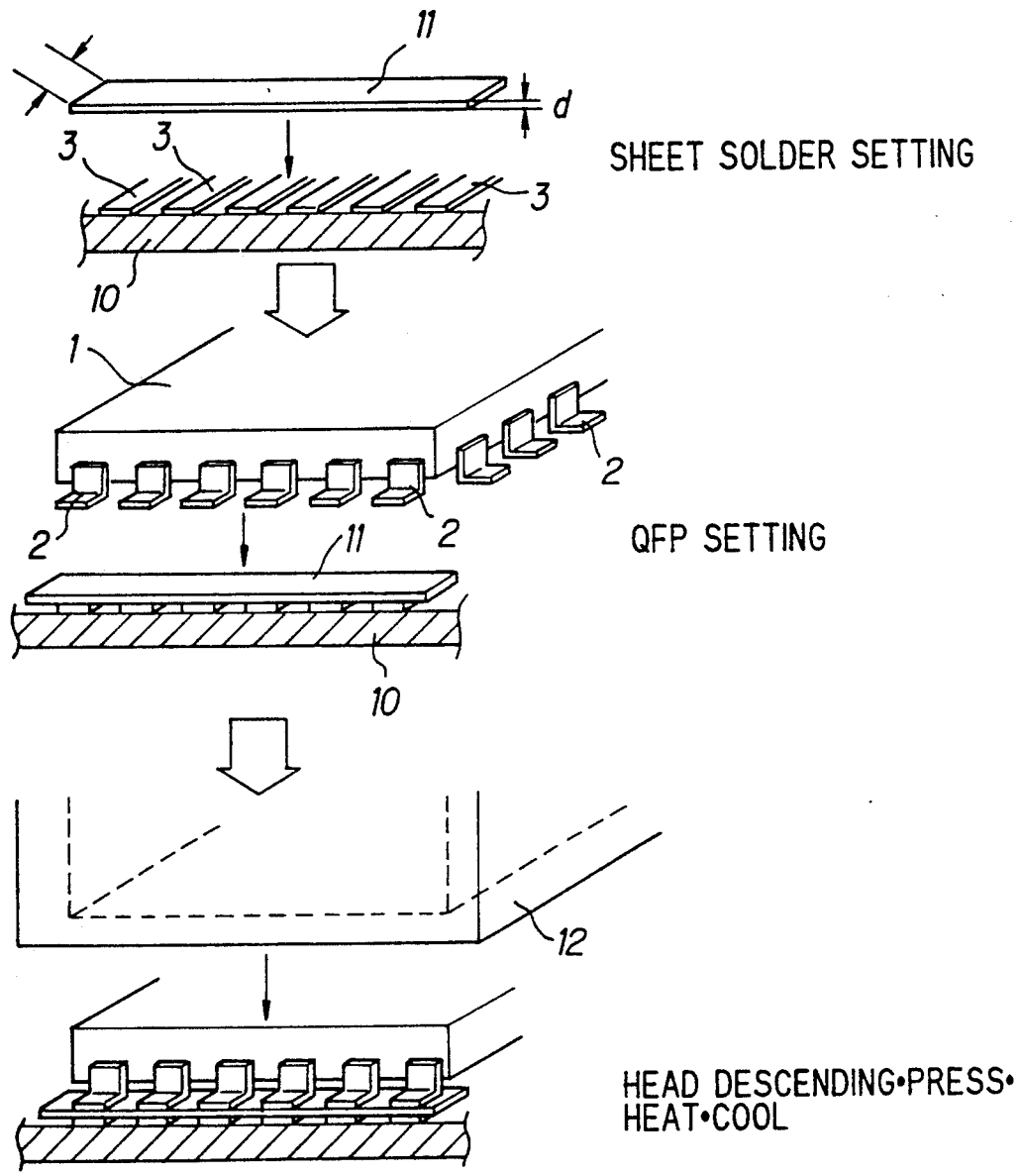
FIG. 2 is a diagram showing a series of processes (A) to (D) for soldering a multiple lead element using a soldering method of this invention.
Figure 2:
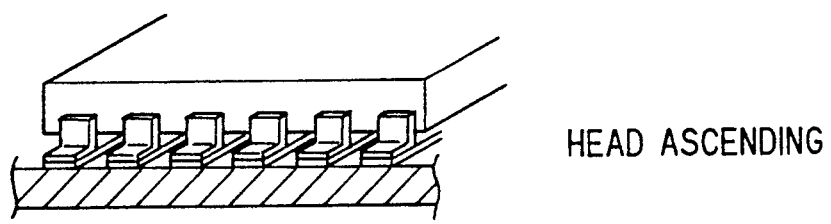

FIG. 2 is a diagram showing a series of processes (A) to (D) for soldering a multiple lead element using a soldering method of this invention, and the same elements as FIG. 1 are represented by the same reference numerals.

In FIG. 2, a reference numeral 10 represents a substrate, and a wiring pattern 3 having land portions to be soldered to the lead terminals of an SMD 1 are formed on the surface of the substrate 10. First, at the step [A], flux is coated on portions of the wiring pattern 3 to be soldered (hereinafter referred to as "land portions"), and then a band-shaped sheet solder 11 is mounted (set) on the wiring pattern 3 as shown in FIG. 2 in such a manner as to be bridged over the land portions of the wiring pattern 3. The band-shaped sheet solder 11 may be designed in 0.03 mm thickness, 1 mm width and 38 mm length (which is dependent on the number of lead terminals of the SMD 1) for the soldering of a rectangular SMD having lead terminals of 0.5 mm pitch, for example. The band-shaped sheet solder 11 is mounted at each of lead terminal positions of the respective sides (four portions) of the SMD 1.

Next, at a step [B], the SMD 1 is automatically fed by an automatic insertion machine in the same manner as the conventional method, and mounted on the predetermined positions of the wiring pattern through the band-shaped sheet solders 11. At a step [C], a trowel 12 for heat press pushes each of the lead terminals 2, and is heated by a heater. The band-shaped sheet solders 11 are melted, and the lead terminals 2 of the SMD 1 are completely soldered onto the land portions of the wiring pattern 3. Thereafter, at a step (D), the heating operation of the trowel is stopped, and it is upwardly drawn at the time when the solder is solidified, thereby completing the soldering process.

The lead terminals and the land portions of the wiring patterns are soldered by melting the band-shaped sheet solder 11, and by setting the thickness of the sheet solder to such a value that surplus solder occurs, and a sufficient amount of solder can be supplied in correspondence to the pitch and number of the lead terminals.

Figure 3:
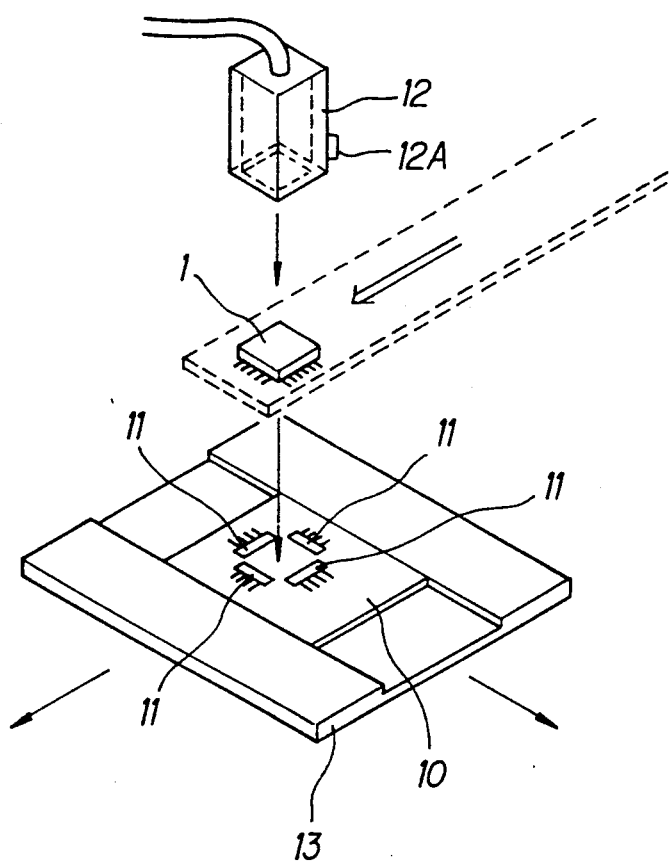
FIG. 3 is a schematic diagram showing the soldering of a multiple lead terminal device by a heat press method.

As shown in FIG. 3, the trowel 12 for heat press is provided at the lower surface thereof with an opening portion whose dimension is equal to the outer dimension of the SMD 1 as shown in FIG. 3, and also provided therein with a sucker for suctionally hold the fed SMD 1 at the lower surface of the trowel 12.

On the other hand, the print wiring board 10 is positioned on a XY table 13 through a position control of a console (not shown) on the basis of the mount position of the SMD 1, and then the band-shaped sheet solder 11 is mounted at a predetermined position.

The trowel 12 which is also provided with a temperature sensor 12A is descended while suctionally holding the SMD 1, then pushed against the band-shaped sheet solder 11 at the position which is matched with the wiring pattern position, and then heated by a heater to carry out the soldering. Thereafter, the heating is stopped, and the trowel 12 is ascended to hold a next SMD at the time when the solder is solidified.

As described above, according to the multiple lead element soldering method of this invention, in place of the cream solder, a band-shaped sheet solder is mounted on the wiring pattern, and the lead terminals and the land portions of the wiring patterns are soldered through the band-shaped sheet solder. Therefore, even when the heat press method is used for the soldering, the lead float and the defective soldering can be prevented, and the positional deviation of the SMD can be also prevented.

In addition, by selecting the thickness of the sheet solder in accordance with each SMD, the soldering can be carried out while matched with various kinds of LSIs and multiple lead elements, and thus the producibility can be improved.

What is claimed is:

1. A method for soldering a multiple-lead element having multiple lead terminals on a wiring board having a wiring pattern thereon, comprising the steps of:

mounting a band-shaped sheet solder on the wiring pattern so as to be bridged over land portions of the wiring pattern which are located at soldering positions of a multiple-lead element;

positioning the multiple-lead element on the band-shaped sheet solder such that the land portions of the wiring pattern are positionally coincident with the multiple lead terminals respectively; and pushing the positioned multiple-lead element while heating the band-shaped sheet solder by a heating member to melt the band-shaped sheet solder, so that the land portions of the wiring pattern and the multiple lead terminals are soldered through the band-shaped sheet solder.

2. The method as claimed in claim 1, further comprising a step of coating flux on the land portions of the wiring pattern before mounting the band-shaped sheet solder on the wiring pattern.

3. The method as claimed in claim 1, further comprising a step of setting the thickness of the band-shaped sheet solder to such a value that surplus solder occurs in a soldering process.

4. The method as claimed in claim 1, wherein the heating member comprises a trowel which is provided at the lower surface thereof with an opening surface whose dimension is equal to the outer dimension of the multiple-lead element, and also provided therein with a sucker for suctionally holding the multiple-lead element.

5. The method as claimed in claim 4, wherein said trowel is further provided with a temperature sensor.

* * * * *